United States Patent [19]

Petlock, Jr.

[11] 4,307,928

[45] Dec. 29, 1981

[54] BELLOWS-TYPE ELECTRICAL TEST CONTACT

[76] Inventor: William Petlock, Jr., 819 N. Concord St., Santa Ana, Calif. 92701

[21] Appl. No.: 67,344

[22] Filed: Aug. 17, 1979

[51] Int. Cl.³ .......................................... H01R 13/24
[52] U.S. Cl. ........................ 339/254 M; 324/158 F; 339/252 S
[58] Field of Search ................... 339/48, 49 B, 61 R, 339/61 M, 61 C, 108 TP, 252 R, 252 S, 254 R, 254 M, 255 R; 324/158 P, 158 T, 158 F; 204/9

[56] References Cited
U.S. PATENT DOCUMENTS 3,209,305  9/1965  Bruckner et al. ................ 339/61 C
3,290,762 12/1966  Ayuzawa et al. ...................... 204/9
4,029,375  6/1977  Gabrielian ..................... 339/254 M Primary Examiner—Neil Abrams
Attorney, Agent, or Firm—G. Donald Weber, Jr.

[57] ABSTRACT

The invention is a unique test contact and connector useful in automatic testing equipment (ATE). The contact connector has a bellows-type configuration which has no internal moving or sliding parts. Compliance is effected through compression of the bellows. With a helical bellows design, the contact permits the contact to provide a "wiping action" which is desirable in electrical testing apparatus. Both the contact and the method of making same are described.

11 Claims, 9 Drawing Figures

U.S. Patent  Dec. 29, 1981  Sheet 1 of 2  4,307,928
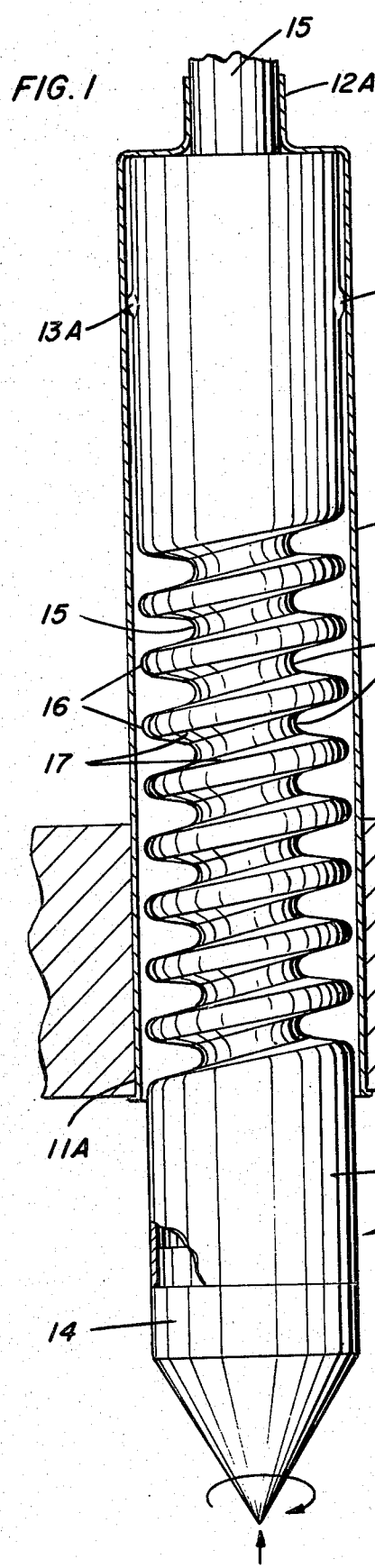
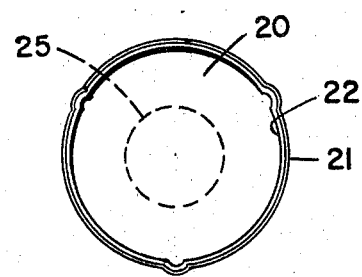
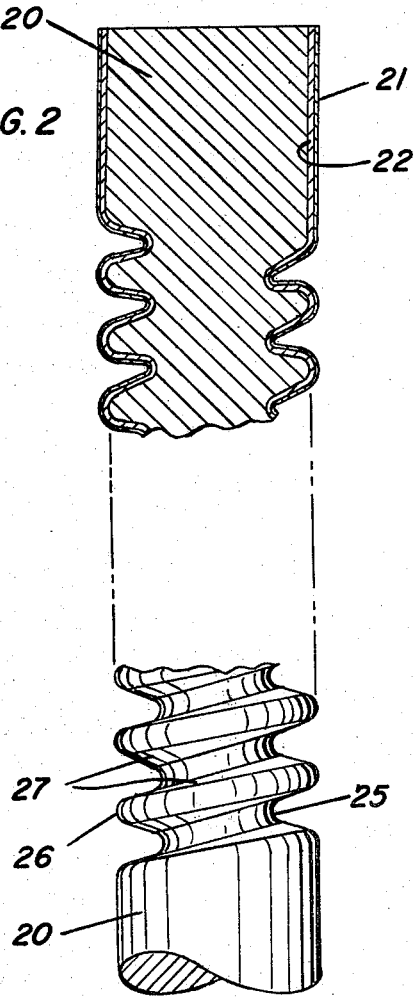
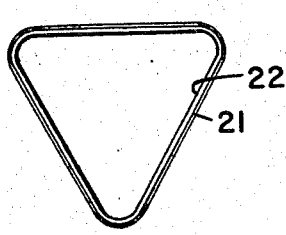

BELLOWS-TYPE ELECTRICAL TEST CONTACT

BACKGROUND

1. Field of the Invention

This invention is directed to the automatic test equipment field, in general, and to a new and unique contact/connector element to be used therewith, in particular.

2. Prior Art

The electronics industry is a rapidly growing industry. Virtually any type of operation can now be controlled by an electronic device of some kind. Many of these devices, from the smallest consumer product to giant main frame computers, use printed circuit boards or printed wiring boards. In fact, in most cases, these circuit boards are the working heart of the electronic devices. Needless to say, the value and usefulness of these electronic devices is dependent upon the verity and integrity of the circuits provided on the circuit board. Consequently, the circuits must be tested for continuity, opens, shorts, the ability to withstand high-voltage surges, and the like. Such testing has been increasingly performed by automatic testing equipment (ATE) as opposed to old-fashioned hand testing.

In point of fact, as new applications of circuit boards are developed, the circuits thereon become more complex and the testing becomes more difficult. Consequently, computer-based test equipment is now recognized as an economic necessity. The complexity of the boards (and the difficulty in testing) is a function of the density of the components placed on the circuit board as well as the use of multi-layered printed circuit boards.

In addition, testing is necessary on the bare board as well as the board after it has the multiplicity of components applied thereto. Also, testing of the entire system, i.e., systems with multiple boards therein, is required to establish proper functioning of the various elements and components in the operational environment.

The automatic testing equipment field is serviced by many manufacturers. These manufacturers produce various types of equipment to test printed circuit boards in various stages of fabrication. To date, several of these manufacturers have produced machines or devices which include a plurality of electro-mechanical contacts or test points. The number of test points in the respective devices may range from a few hundred to approximately 50,000. However, these test points have turned out to be the weak link in the testing apparatus. That is, the known test points generally comprise a multiple part element. For example, it is frequently found that the known test points comprise at least three or four components. The known test points include a first contact member which is inserted into the test equipment and permits electrical contact to be made thereto. A mating sleeve is inserted into the contact sleeve and serves to maintain a spring therein. The actual contact tip also is disposed in the second mentioned sleeve and is spring biased by the spring which is mounted within the sleeve combination. The spring biased tip is utilized inasmuch as circuit boards are frequently out of planar alignment wherein rigid contact tips or points can be broken. Nevertheless, the multi-part contact test point still suffers from problems insofar as reliability and sturdiness of construction are concerned. That is, the spring element frequently deteriorates or the tip can be broken despite the resilient construction. For these and other reasons, the currently available test points exhibit several shortcomings and improved test point contacts are desired.

SUMMARY OF THE INVENTION

The test contact/connector of the instant invention is fabricated, generally, as a unitary member. The tip of the contact is of standard construction and configuration. The tip is affixed to or fabricated with a miniature metal bellows portion. The bellows portion has, in a preferred embodiment, a helical configuration. The bellows permits the test contact to have resiliency when applied to the printed circuit board or device under test. The preferred helical arrangement permits the test point to also provide a rotational movement when compressed whereby the tip produces a wiping action relative to the fixture under test.

BRIEF DESCRIPTION OF THE DRAWINGS

FIG. 1 is a partially sectioned, partially broken-away view of the test contact/connector of the invention.

FIG. 2 is a partially sectioned, partially broken-away view of the mandrel used in forming the connector of the instant invention.

FIG. 3 is an end-view of the mandrel shown in FIG. 1.

FIG. 9 is an end view of another embodiment of the shank end of the contact/connector.

DESCRIPTION OF A PREFERRED EMBODIMENT

Figure 4:
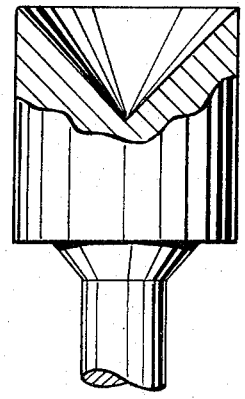
FIGS. 4 through 7 show variations on the tip styles which can be used with the bellows contact of the instant invention.

Referring now to FIG. 1, there is shown a partially broken away, partially sectioned view of contact 10 of the instant invention. A suitable fixture plate 11 made of a non-conductive (electrical) material, such as fiberglass epoxy, is provided for supporting the test contacts or pins. The fixture plate 11 is of typical or known configuration and construction and does not form a portion of the invention, per se.

A suitable receptacle sleeve 12 is placed in aperture 11A in fixture plate 11 by means of a suitable technique. A press fit or the like is typical. Sleeve 12 is of standard or known configuration and may be a copper-alloy material or the like. Sleeve 12 includes, at the interior end thereof, the sleeve portion 12A which in this embodiment, is an integral portion of sleeve 12 which has been swaged down to a smaller diameter to mate with a wire wrap pin. Alternatively, sleeve portion 12A can be formed to have a wire crimped thereto or it can be formed as a solder cup for direct wire soldering thereto. In a typical configuration, wire wrap pin 15 is 0.025 inches square. This type of arrangement is known in the art and is useful in conjunction with this invention, but it is not limitative thereof.

In the preferred embodiment, the body of the bellows contact 13 is substantially cylindrical in configuration and is basically a hollow member having openings at either end. At the interior end, bellows 13 includes the bumps or dimples 13A which are used to create a friction fit with sleeve receptacle 12. In addition, the bumps 13A establish a fixed electrical connection between receptacle 12 and bellows contact 13. In an alternative arrangement, the interior end of bellows 13 may be formed in a generally triangular configuration to inhibit contact rotation (see FIG. 9).

At the opposite end of bellows 13, there is included an opening which receives a suitable test tip 14. Typically, tip 14 is joined to bellows contact 13 by a pressure or force fit although other joinders can be effected. In the embodiment shown in FIG. 1, test tip 14 is a pointed tip which is used to contact the fixture which is to be tested. Although not necessarily so limited, tip 14 can be a beryllium copper material which is plated with a precious metal or the like. The pointed tip configuration in FIG. 1 is illustrative only, and a large number of styles (on the order of 10) of tips are available. Of course, it must be recognized that the tip can be formed as an integral part of the contact by formation with the bellows.

The main body of bellows contact 13 includes the bellows portion. In the preferred embodiment, the convolutions are formed in a spiral or helical configuration to impart both rotational and translational movement to the test tip. The bellows include the peaks 16 and the troughs 15 which are connected by the sidewalls 17 of suitable pitch as described hereinafter. In fact, the convolutions can be rectangular shape (see FIG. 8). As noted, the bellows portion, including the helical portion thereof, can be formed of nickel which is plated with a precious metal, or any other suitable electrically conductive material or alloy.

As suggested by the arrows on bellows 13, when tip 14 is moved horizontally (or vertically) in the testing operation, the helical or spiral formation of the bellows portion of contact 13 will both contract in a linear fashion and, as well, rotate around the central axis thereof. Consequently, the self-aligning feature of the test board is maintained. In addition, and perhaps more importantly, the rotational aspect of the contact permits a wiping action to be obtained between the contact tip and the test fixture involved.

Referring now to FIG. 2, there is shown a partially sectioned, partially broken-away view of the mandrel which is used in forming the bellows contact of the instant invention. In this embodiment, the mandrel is formed of an aluminum alloy rod although other types of materials can be utilized. The rod or mandrel is formed, i.e., machined, molded or the like, to have the configuration shown at the lower end thereof. That is, rod 20 is machined to have a spiral or helical configuration comprising peaks 26, troughs 25, and sidewalls 27, which correspond to the peaks, troughs and sidewalls of the bellows, as shown in FIG. 1. In the embodiment shown, the rod has an outer diameter of 0.052 inches. The dimension (i.e. root diameter) between the opposing troughs is on the order of 0.024 inches. In addition, the respective convolutions have a pitch of approximately 0.016 and inner and outer radii of 0.0028 inches. Of course, any other suitable dimensions can be used for larger or smaller bellows contacts.

In the preferred embodiment and method of fabrication, the mandrel 20 is formed of an aluminum alloy rod. As shown in FIG. 3 and at the upper end of FIG. 2, a first layer 22 of nickel is deposited or plated onto the surface of mandrel 20. A second layer 21 formed of a precious metal is formed on the surface of layer 22. In addition, it may be desirable to include a flash layer of copper or some other highly conductive metal between the layers.

Layer 21 is quite thin with regard to the thickness of layer 22. Typically, the thickness of layer 21 is about $1 \times 10^{-5}$ inches. The thickness of layer 22 is directly related to the desired spring rate for the bellows. For example, a thickness of about 0.0005 inches may provide a spring rate of 2-3 ounces for the desired travel. Alternatively, a wall thickness of about 0.0006 inches may provide a spring rate of 7-8 ounces. Various spring rates are desirable in different applications and the thickness will vary accordingly.

After the layers 22 and 21 have been formed on mandrel 20 by any suitable method such as electrodeposition or electroless deposition (virtually any electroforming technique can be used) a suitable etching or material removing process is utilized to remove mandrel 20 from the composite structure shown in FIG. 2. That is, when the aluminum alloy rod is used to form mandrel 20, an etching material which etches or dissolves the aluminum alloy, but does not adversely attack or affect layers 21 or 22, is used to dissolve mandrel 20. When the mandrel has been completely dissolved, a hollow bellows device is provided. This hollow bellows device is the bellows contact 13 shown in FIG. 1.

In a suitable arrangement, the mandrel will have an appropriate number of convolutions such that bellows 13 will have approximately 25 "effective" convolutions which will occupy a distance of approximately 0.4 inches. The effective convolutions are those convolutions which permit lateral (and rotational) motion as suggested in FIG. 1. Of course, the length of the effective convolutions can be varied. That is, the number of convolutions will vary depending upon desired travel of the test tip. In most cases, this travel will be on the order of 0.187 to 0.25 inches. As described herein, each convolution will permit travel of about 0.006-0.007 inches although design modifications can alter this figure readily.

Referring now to FIG. 3, there is shown an end view of the mandrel and layer composite shown at the upper end of FIG. 2. The view of FIG. 3 is provided when the mandrel 20 is still in existence. The dashed lines indicate the internal grooves or troughs formed by the convolutions.

Referring now to FIGS. 4 through 7, there are shown typical configurations of tips which can be used with the instant invention. These tips are known in the art and do not form a portion of the invention, per se. Moreover, only some of the well-known tip configurations are illustrated. For example, FIG. 4 shows a tip (partially broken away) with an inward-cone end surface thereof. This tip is typically formed of beryllium copper. It must be understood that the tip shown in FIG. 4 is a so-called large inward cone tip. A small inward cone tip can be produced by merely reducing the head portion of the tip.

Figure 5:
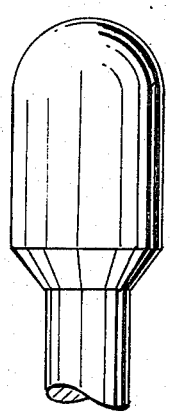

Similarly, FIG. 5 shows a spherical tip wherein the outer surface is defined as having a spherical configuration. Typically, this type of tip is formed of a lead-nickel-copper material. Again, a smaller diameter spherican tip can be produced.

Figure 6:
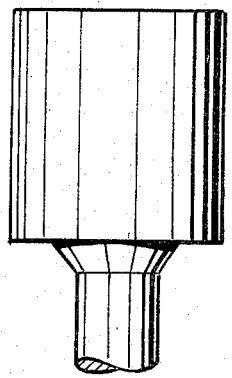

FIG. 6 shows a large flat tip which is typically formed of the lead-nickel-copper material noted above. This tip has a flat outer surface and, of course, can be made smaller or larger as desired.

Figure 7:
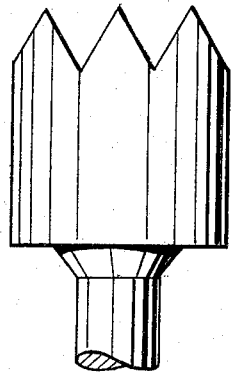

FIG. 7 shows a multi-pointed tip (in this case nine points) which can be formed of beryllium copper. This tip can be considered a variation of the so-called pointed tip as suggested in FIG. 1. Moreover, this tip would probably be used with a bellows contact that did not permit a rotating, wiping action.

Each of the tips shown and described includes a shank end for insertion into the exterior end of bellows 13 (see FIG. 1). In addition, each tip has preferred areas of utilization and each can be used in an appropriate application. The tip does not form a portion of the invention, per se, and any tips can be used with bellows depending upon the requirements of the user. However, it must be understood that any of the tip configurations shown can be provided as an integral part of the bellows contact itself.

Figure 8:
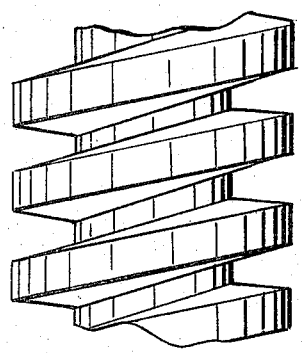
FIG. 8 is a portion of a "square" bellows contact.

Referring now to FIG. 8, there is shown a portion of a modified bellows contact/connector. In this embodiment, the troughs and crests of the convolutions are "squared off." The net effect of this bellows configuration is substantially identical to the "rounded" bellows. However, in some cases this configuration may be easier to form in the mandrel.

Referring to FIG. 9, there is shown an end view of a modified shank end portion 13 of a contact/connector 10. This triangular configuration may permit a better gripping and electrically contacting arrangement in some cases.

Thus, there has been shown and described a preferred embodiment of the instant invention. In this invention, a mandrel is formed of any suitable material that will support an original shape, i.e., the helical configuration, but which is later removed, for example, by dissolving or the like. One or more layers of material are formed on the mandrel to conform to the configuration thereof. These layers are formed of materials which are electrically conductive and yet are not damaged or destroyed by whatever method is used to remove the mandrel. In a preferred embodiment, the mandrels are formed of aluminum and the layers are formed thereon by electroless plating, electrodeposition or some other deposition technique. The plating materials are, in addition to being electrically conductive, generally non-tarnishing and, as well, avoid any other related problems, such as burring, brittleness, or the like.

While suitable materials for both the mandrel and the layers have been described, it must be understood that other materials can be used. For example, it is contemplated that the mandrel can be formed of wax or some other material wherein it can be removed through the application of heat. Of course, if a non-electrically conductive material is used, the mandrel must first be coated with a conductive ink or other similar material to promote plating. In addition, the bellows materials can be formed of any appropriate metal or metal alloy which will retain the shape described, be electrically conductive and have the other attributes and characteristics noted above.

In addition, some suggestive and illustrative dimensions have been presented. It must be understood that these dimensions are illustrative only and are not intended to be limitative. Rather, the scope of the invention is defined only by the claims appended hereto.

Clearly, those skilled in the art may conceive of modifications to the specific details noted and described. However, any such modifications which fall within the purview of this description are intended to be included herein as well.

Having thus described a preferred embodiment of the instant invention, what is claimed is:

1. A test contact including,
   a hollow, substantially cylindrical sleeve having first and second ends and which is open at at least said first end thereof,
   a hollow, substantially cylindrical body disposed within said sleeve,
   said body and said sleeve each formed of an electrically conductive material,
   a plurality of convolutions formed in said body to permit said body to be resiliently compressed along the length thereof so that said body can move independently of said sleeve in the axial direction thereof, and
   first and second end portions of said body adapted to operate as electrical connector means,
   said first end portion of said body electrically connected at said second end of said sleeve.
2. The test contact recited in claim 1 including,
   test tip means for contacting the device to be tested,
   said test tip electrically connected to said second end portion of said body.
3. The test contact recited in claim 3 wherein,
   said test tip means and said body are formed as an integral unit.
4. The test contact recited in claim 1 wherein
   said convolutions are formed in a helix configuration to cause said body to rotate when compressed.
5. The test contact recited in claim 1 wherein,
   said convolutions have a rectilinear configuration.
6. The test contact recited in claim 1 wherein,
   said body is formed of a plurality of layers of electrically conductive materials.
7. The contact recited in claim 1 wherein,
   said body and said sleeve are connected by a friction fit.
8. The contact recited in claim 1 wherein,
   said first end portion is substantially triangular in configuration.
9. The contact recited in claim 1 wherein,
   said convolutions are disposed substantially intermediate said first and second end portions which are substantially cylindrical in configuration.
10. The contact recited in claim 1 wherein,
    said sleeve and said body are arranged concentrically relative to each other.
11. The contact recited in claim 7 wherein,
    at least one of said body and sleeve includes bumps or dimples which create the friction fit.

* * * * *